United States Patent [19]

Banholzer et al.

[11] Patent Number: 5,363,556
[45] Date of Patent: Nov. 15, 1994

[54] WATER JET MIXING TUBES USED IN WATER JET CUTTING DEVICES AND METHOD OF PREPARATION THEREOF

[75] Inventors: William F. Banholzer, Columbus, Ohio; Thomas R. Anthony, Schenectady; Robert S. Gilmore, Burnt Hills, both of N.Y.; Paul A. Siemers, Clifton Park, N.Y.; John C. McCloskey, No. Attleboro, Mass.

[73] Assignee: General Electric company, Schenectady, N.Y.

[21] Appl. No.: 99,989

[22] Filed: Jul. 30, 1993

Related U.S. Application Data

[63] Continuation of Ser. No. 858,831, Mar. 27, 1992, abandoned.

[51] Int. Cl.⁵ .......................... B05B 1/02; B05D 7/22; C23C 16/26; B29C 41/02
[52] U.S. Cl. ................................. 29/890.142; 29/424; 29/426.5; 427/237; 427/249; 427/255.7; 264/81; 264/237; 264/342 R; 264/348; 156/664; 164/98; 239/10; 239/379; 239/DIG. 19
[58] Field of Search .................. 239/10, 379, DIG. 19; 427/249, 250, 236, 237, 255.7; 204/192.32; 264/81, 237, 243 R, 348; 156/664; 29/890.142, 424, 426.5; 164/98

[56] References Cited

U.S. PATENT DOCUMENTS

| | | |
|---|---|---|
| 4,600,149 | 7/1986 | Wakatsuki ........................ 239/120 |
| 4,707,384 | 11/1987 | Schachner et al. . |
| 4,768,709 | 9/1988 | Yie ........................................ 239/8 |
| 4,786,566 | 11/1988 | Siemers . |
| 4,816,286 | 3/1989 | Hirose . |
| 4,960,643 | 10/1990 | Lemelson . |
| 4,978,585 | 12/1990 | Ritter . |
| 4,981,643 | 1/1991 | Siemers et al. . |
| 5,033,681 | 7/1991 | Munoz ............................... 239/596 |
| 5,042,710 | 8/1991 | Siemers et al. . |

FOREIGN PATENT DOCUMENTS 62-296707  5/1989  Japan .

OTHER PUBLICATIONS

Partial Translation of JP 62-296707, filed Nov. 25, 1987.
A Penton Publication American Machinist-Wet Grit Abrasive Waterjets, A Special Report, p. 84 -Oct. 1989.
High-Pressure Waterjet Cutting: An Introduction, Jayanta K. Guha-Ceramic Bulletin, vol. 69, No. 6, 1990-pp. 1027-1029.

*Primary Examiner*—Shrive Beck
*Assistant Examiner*—Bret Chen
*Attorney, Agent, or Firm*—William H. Pittman

[57] ABSTRACT

An improved two membered substantially crack-free water-jet mixing tube of an abrasive water jet cutting device and a method of its preparation. The method comprises chemically vapor depositing diamond layer on a funnel shaped support member to form an inner member of the mixing tube, separating the inner member from the support member, depositing and then cooling an outer member on the outer side of the inner member to produce a compressive stress on the inner member that substantially prevents formation cracks on the inner member. The inner side of the inner member has a smooth bore having a microcrystalline structure and the outer member has a higher coefficient of thermal expansion than diamond. The invention is also directed to a water jet cutting device that incorporates the aforementioned improved substantially crack-free water jet mixing tube.

11 Claims, 7 Drawing Sheets

WATER JET MIXING TUBES USED IN WATER JET CUTTING DEVICES AND METHOD OF PREPARATION THEREOF

CROSS REFERENCE TO RELATED APPLICATIONS

This application is a Continuation of application Ser. No. 07/858,831 filed Mar. 27, 1992, now abandoned.

Reference is made to commonly assigned, copending applications, Ser. No. 07/713,499, filed on Jun. 12, 1991, for An Improved Method for Producing Articles by Chemical Vapor Deposition and The Articles Produced Therefrom and to Ser. No. 07/464,818, filed on Jan. 16, 1990 for CVD Diamond Coated Annulus Components and Method of Their Fabrication, both of which are incorporated herein by reference.

FIELD OF THE INVENTION

The present invention generally relates to improved cutting devices used for cutting materials by hydro-machining and more particularly concerns a method of producing improved diamond water jet mixing tubes having improved crack resistance and high length to diameter (L/D) ratios.

BACKGROUND OF THE INVENTION

In recent years hydro-machining methods, including water jet cutting, have undergone significant advances. The reasons are obvious. A high pressure liquid jet, such as a water jet, can cut through several types of materials quite easily and it can be even programmed, through a computer software, to cut intricate patterns. Hydro-machining methods have been also used extensively in cutting patterns in various industries, such as the garment industry, the corrugated carton manufacturing industry, aircraft industries, electronics industry, and so on. Additional list of the application of hydro-machining is provided on page 91-95 of *Wet Grit, Abrasive Waterjets*, American Machinist, October 1989, Penton Publishing, Inc., Cleveland, Ohio, pages 84-97, incorporated herein by reference. For a general summary of various hydro-machining methods including water jet cutting methods, reference is made to the aforementioned special report on *Wet Grit, Abrasive Waterjets*, and to Guha, J., *High-Pressure waterjet Cutting: An Introduction*, Ceramic Bulletin, Vol. 69, No.6, 1990, pages 1027-1029, both incorporated herein by reference.

One of the major difficulties encountered in the hydro-machining technology is the short life span of the water jet mixing tubes used in the hydro-machining devices. The presence of abrasive particles in the water jets used in the hydro-machining devices reduces the life span of these mixing tubes due to abrasion. However, the life span of these mixing tubes can be significantly extended by producing them from diamond. Diamond is an allotrope of carbon exhibiting a crystallographic network comprising exclusively of covalently bonded, aliphatic $sp^3$ hybridized carbon atoms arranged tetrahedrally with a uniform distance of 1.545 Å between atoms and it is extremely hard, having a Mohs hardness of 10.

A method directed to improving the abrasion resistance of the annular interior surface of an annulus has been disclosed. Such a method comprises chemical vapor depositing abrasion resistant materials, such as diamond on the annular interior surface, which is placed in compression by virtue of the difference in the coefficients of thermal expansion between the annulus material and the CVD deposited diamond layer. However, the aforementioned method is not suitable to producing crack resistant articles having high L/D ratios (about 50) because it is difficult to chemically vapor deposit diamond along the annular interior surfaces of articles having high L/D ratios. By way of example, it is difficult to deposit diamond on the interior wall of an article of a funnel shape having a small diameter stem of about 0.500 millimeter outer diameter and having a long stem length of about 75 millimeters. The present invention is directed to addressing the problem of making such crack resistant funnel shaped articles having high L/D ratios.

STATEMENT OF THE INVENTION

The present invention is directed to an improved method of producing a two membered substantially crack-free water jet mixing tube of an abrasive water jet cutting device comprising, chemical vapor depositing a diamond layer on a support member to form an inner member of the tube, the inner member having a smooth inner side of diamond with a microcrystalline structure, separating the inner member from the support member, depositing an outer member material having a higher coefficient of thermal expansion than diamond on an outer side of the inner member to form an outer member of the tube, and cooling the tube to contract the outer member for inducing compressive stresses of sufficient strength on the inner member to substantially prevent formation of cracks in the inner member.

The present invention is also directed to an improved abrasive water jet cutting device comprising, a water reservoir having an orifice positioned therein, means for producing a jet of water through the orifice, a funnel shaped two layered water jet mixing tube positioned in the path of the jet of water, the mixing tube comprising a substantially crack-free inner member of diamond layer under compressive stress, the inner member having a smooth inner side with a microcrystalline structure, and an outer member of a material having higher coefficient of thermal expansion than diamond, disposed on an outer side of the inner member, means for introducing abrasive particles along the funnel of the mixing tube, such that the abrasive particles are entrained in the jet of water exit out of the mixing tube to form an abrasive water jet, and means for controlling the abrasive characteristics of the abrasive water jet.

DETAILED DESCRIPTION OF THE PREFERRED EMBODIMENT

Figure 1:
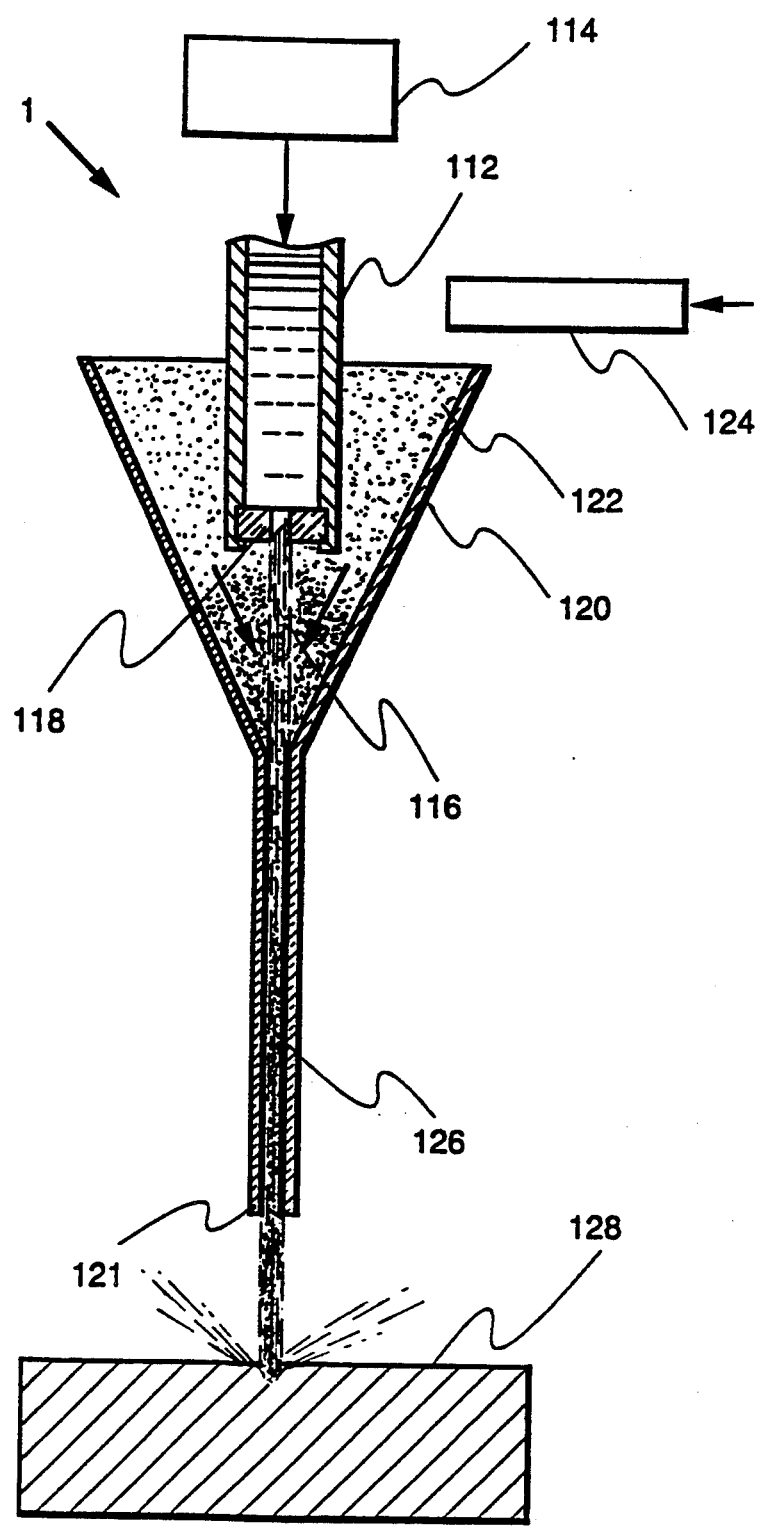
FIG. 1 illustrates a cross sectional view of a partial abrasive water jet assembly.

Continuously flowing water gradually erodes the surfaces it contacts. That is how rivers and streams form paths that cut through mountains and valleys. Natures slow erosion process can be transformed into a high-speed cutting action by increasing the force provided by a jet of water. When water is compressed to ultra high pressure levels, such as about 37 MPa (5400 psi) and released through a small opening about 0.01 to 0.02 millimeters (about 0.0004 to 0.0008 inches) in diameter, the expanding water stream attains a speed up to three times the velocity of sound. Such a focused jet of water, traveling at an estimated velocity of about 869 meters per second (1945 miles per hour) releases sufficient kinetic energy to cut through most of even hard-to-cut materials, such as ceramics and hardened metals and their alloys.

When the force produced by the conversion of kinetic energy of the water jet as it impacts against the workpiece surface, exceeds the compressive strength of the material being cut, a cutting action takes place. Depending on the properties of the workpiece material, the actual cutting is a result of surface erosion, shearing or failure under rapidly changing, localized stress fields. The aforedescribed cutting process produces insignificant thermal or mechanical distortion on the workpiece and it is almost dust free.

The capacity of the water jet to perform the cutting action by erosion is represented by its kinetic energy, $$\text{Kinetic Energy (KE)} = MV^2/2, \quad (1)$$

where (M) is the mass of water molecules and (V) is the velocity of water in the water jet provided by, $$V = G/D^2 \quad (2)$$

where G is the volumetric rate of water at constant pressure passing through an orifice of diameter D.

The effectiveness of the abrasive action of the water jet can be significantly increased by adding fine abrasive particles to the water jet stream. Suspended particles in water jet stream move at the same high velocity as the water. Since the mass of the particles in the water jet is significantly higher than the water molecules, the overall kinetic energy at the impingement of the water jet against the workpiece would be also significantly higher. Thus, the addition of abrasive particles in the water creates a ballistic effect. The particles bombard the workpiece surface, similar to small particulates, with energy levels that are several times higher than the water medium that carries them. The mass differential between water and abrasive particles creates a pulsed erosion process that is extremely effective on hard-to-cut materials. This process is sometimes referred to as abrasive water jet (AWJ) cutting and the particles entrained in the abrasive water jet accomplish almost 90% of the cutting action.

Typical abrasive particles employed in the AWJ cutting process are garnet, aluminum oxide, silicon nitride and diamond in mesh sizes that vary from about 36 to 150. Garnets of mesh size about 80 to 100 are preferred. Typical AWJ nozzle diameters range from about 0.075 to 2.50 millimeters, preferably about 1.00 millimeter and the distance between the AWJ nozzle and the workpiece surface generally varies from about 0.05 to 1.50 millimeters. The AWJ process produces a very powerful cutting tool and its shearing action can cut metals and other hard materials, such as ceramics of over 150 millimeters in thickness.

However, the AWJ process suffers from a major drawback. The abrasive particles exiting through the AWJ drastically abrade a water jet mixing tube of the AWJ in which, mixing and entrainment of the abrasive particles occurs. Conventional carbide water jet mixing tubes have to be replaced every two to four hours, sometimes even more frequently. However, the life of water jet mixing tubes can be significantly increased, i.e., up to about 20 to 100 hours by making them from diamond. FIG. 1 shows a typical partial AWJ assembly arrangement, referred to by numeral 1, that illustrates the relevant components. A liquid reservoir 112 contains a fluid, typically water, under a high pressure provided by pumping means 114 to produce a water jet 116 through an orifice 118. Water jet 116 is generally co-centrally positioned within the bore of a water jet mixing tube 120. Water jet mixing tube 120 is generally provided with a funnel shape to allow easy flow of the abrasive particles 122 introduced into the funnel shape of mixing tube 120 through an abrasive particle delivery system 124. Metering means (not shown) are provided to control the flow of abrasive particles 122 into the funnel of mixing tube 120.

In operation, as the high pressure water jet 116 flows out of orifice 118 into the funnel shape of mixing tube 120, a partial vacuum is created in the funnel, which in turn induces a flow of abrasive particles 122 forward to an exit end 121 of mixing tube 120. The aforementioned action also accomplishes mixing and entrainment of particles 122 to produce an AWJ stream 126, which is then used to cut a workpiece 128.

To achieve an optimal cutting action, particles 122 must be fully entrained in AWJ stream 126 before they jet out of exit end 121 (also referred to as a stem end). In the beginning of the entrainment process, particles 122 are stationary, while water jet 116 is at an extremely high velocity. As particles 122 enter water jet 116, they are bounced off the wall of the stem of mixing tube 120 and then rebounded back into water jet 116. Such a repetitious and violent process continues until particles 122 attain the velocity of water jet 116 to form AWJ stream 126. Thus, it is the presence of the stem wall of the funnel shaped mixing tube 120 which facilitates entrapment of particles 122.

Figure 2:
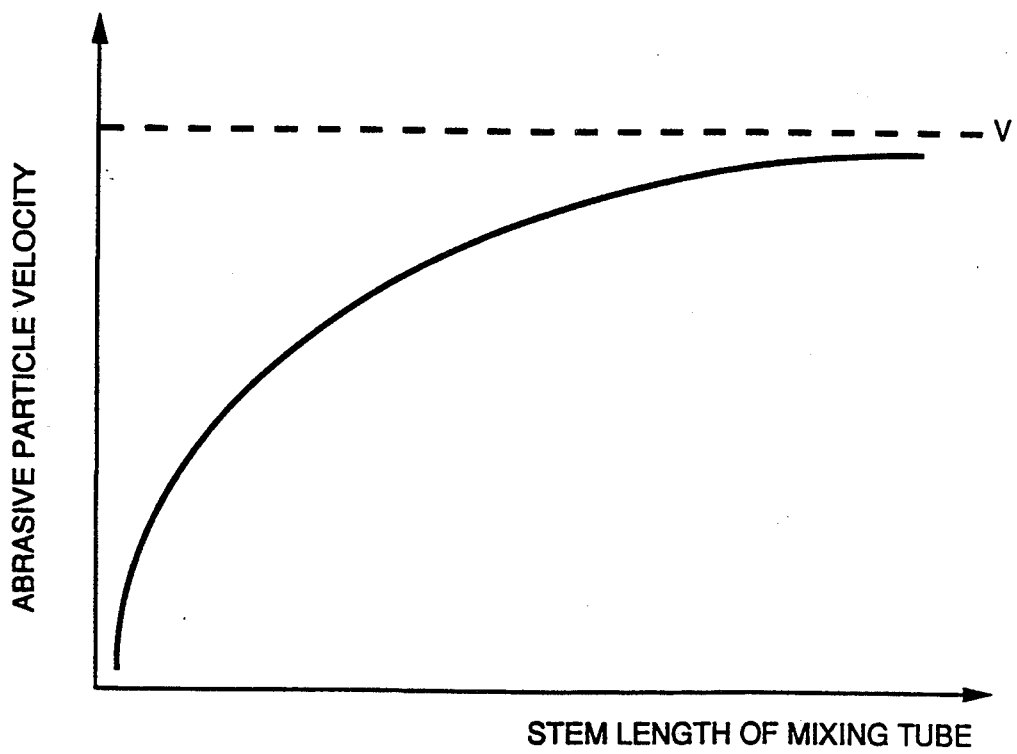
FIG. 2 is a graph of the abrasive particle velocity against the stem length of a water jet mixing tube of the abrasive water jet assembly of FIG. 1.

FIG. 2 graphically illustrates the aforementioned process. FIG. 2 is the graph of the abrasive particle velocity against the stem length of mixing tube 120 of FIG. 1. (V) represents the velocity of water jet 116. It can be ascertained from the graph of FIG. 2 that the velocity of particles 122 increases along the stem length of mixing tube 120 and as stated earlier, the stem wall is subjected to repetitious tensile loads until particles 120 achieve the velocity of water jet 116 to form AWJ stream 126. Thus, a significant portion of the stem length of mixing tube 120 is exposed to the violent bouncing action of particles 122.

Figure 3:
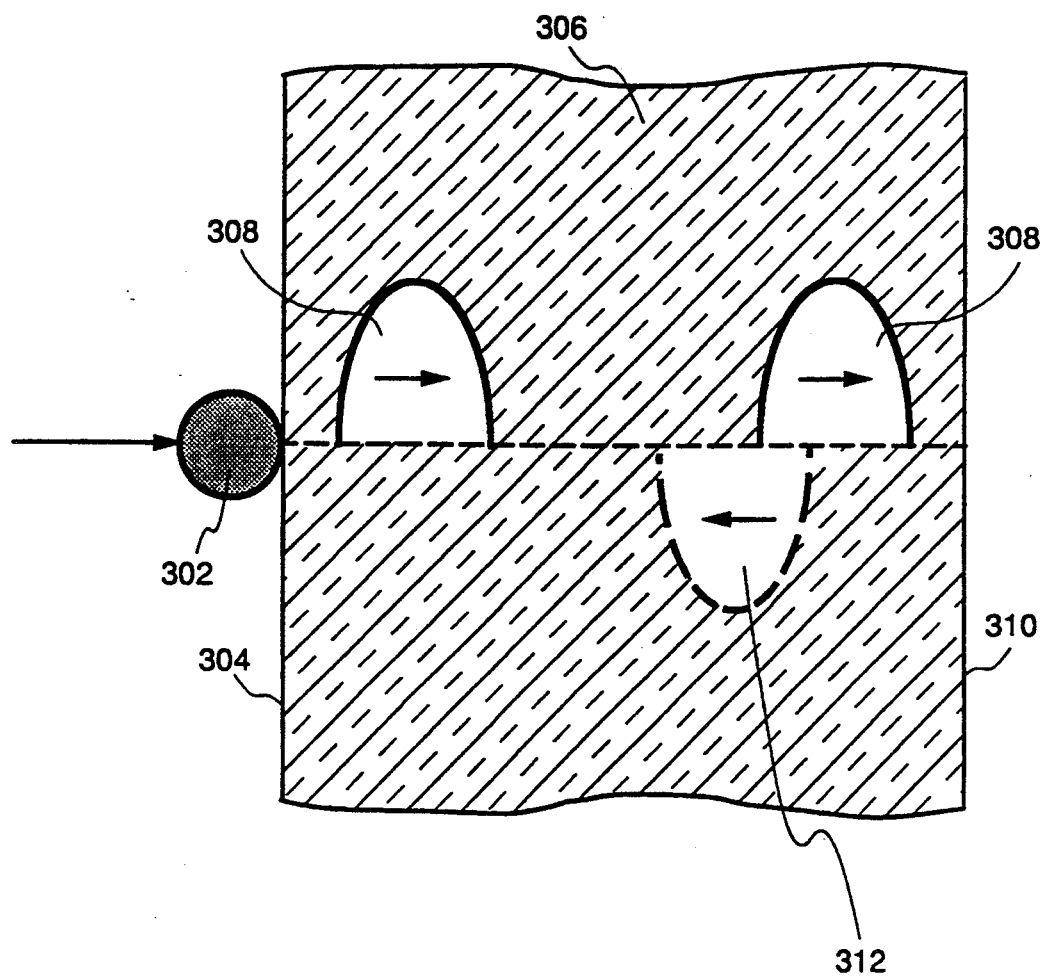
FIG. 3 shows a compression wave and a reflected tension wave transmitted through the wall of the water jet mixing tube of FIG. 1 when an abrasive particle hits the inner wall surface.

As stated earlier, even though the useful life of water jet mixing tube 120 can be extended by making it from diamond, the aforementioned bouncing action significantly affects the life of even a diamond mixing tube, due to the cracks produced on the wall of mixing tube 120 by the bouncing action of particles 122. As shown in FIG. 3, when an abrasive particle 302 hits an inner surface 304 of the stem wall 306 of mixing tube 120 of FIG. 1, a compression wave 308 is created within stem wall 306. As compression wave 308 strikes an outer surface 310 of wall 306, a tension wave 312 is reflected back into stem wall 306. It is well known, that diamond though quite strong in compression, is weak in tension. As a result, tension wave 312 produces cracks in stem wall 306. Thus, even though the mixing tube made of diamond has significantly higher life than the conventional sapphire tubes, it still suffers from damage due to the cracks produced by tension wave 312.

Figure 4A:
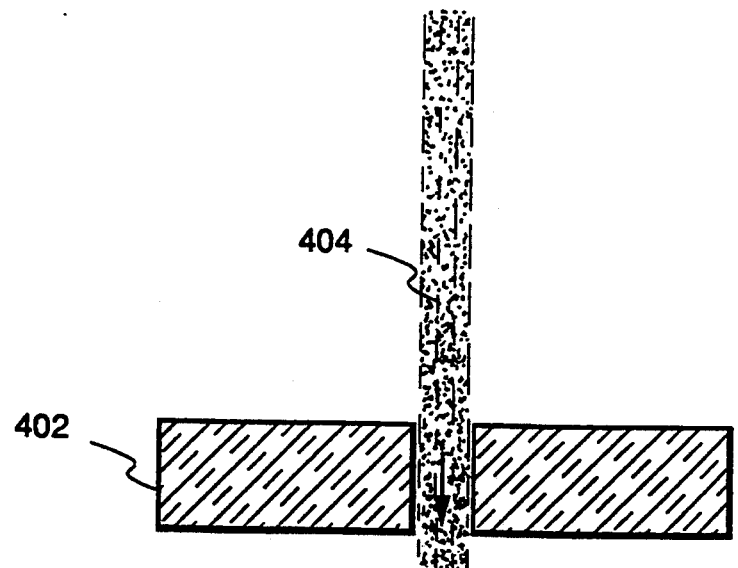
FIG. 4A shows the crack damage that results in a stand alone diamond layer of similar size and characteristics as that of the water jet mixing tube of FIG. 1, when the diamond layer is exposed to an abrasive water jet.
Figure 4B:
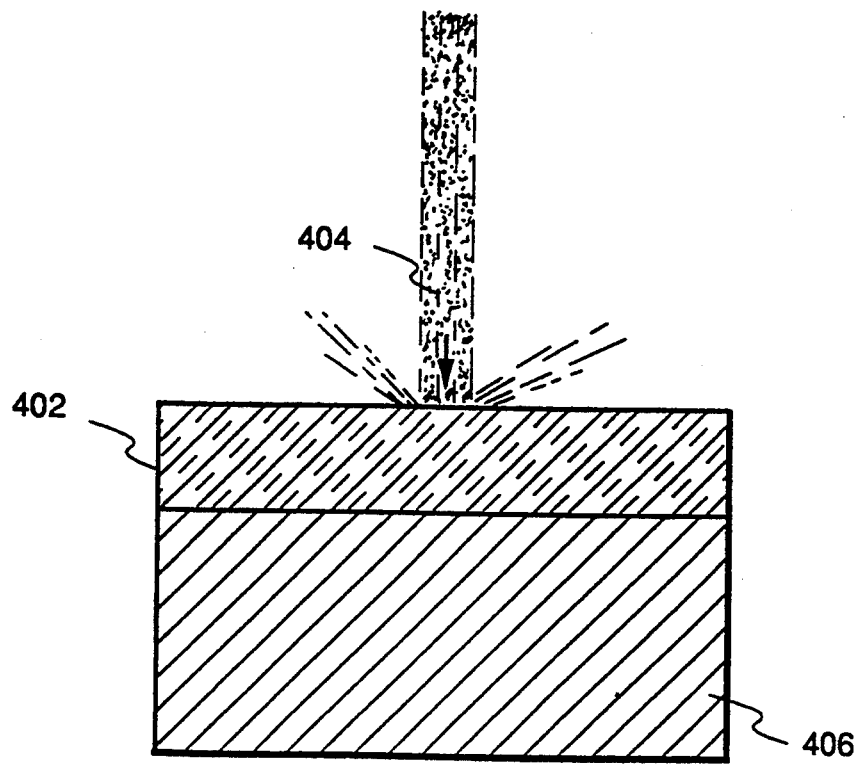
FIG. 4B shows no crack damage to a two membered substrate having a diamond layer similar in thickness and characteristics to the one in FIG. 4A, except for the protection offered by the compressive force provided by an outer member, when the two membered substrate is exposed to the abrasive water jet.

The present invention addresses the aforementioned crack problem experienced by the conventional diamond mixing tubes by providing them with an outer layer that produces compressive stress on the diamond mixing tubes. FIG. 4A shows what happens to a diamond layer 402 when it was subjected to a tension wave created by an abrasive water jet 404. Within a short duration of less than 10 seconds, diamond layer 402 having a thickness of about 0.076 millimeters was cut through. However, as shown in FIG. 4B, when diamond layer 402 was backed up with an outer member 406, such as one of metal, diamond layer 402, under compression, became extremely strong and no ascertainable crack damage from the tension wave generated by the bouncing action of the abrasive particles from water jet 404 was detected. It should be noted that the aforementioned test was more severe than the normal vector forces acting upon the inner walls of the stem of water jet mixing tube 120 of FIG. 1.

Figure 5A:
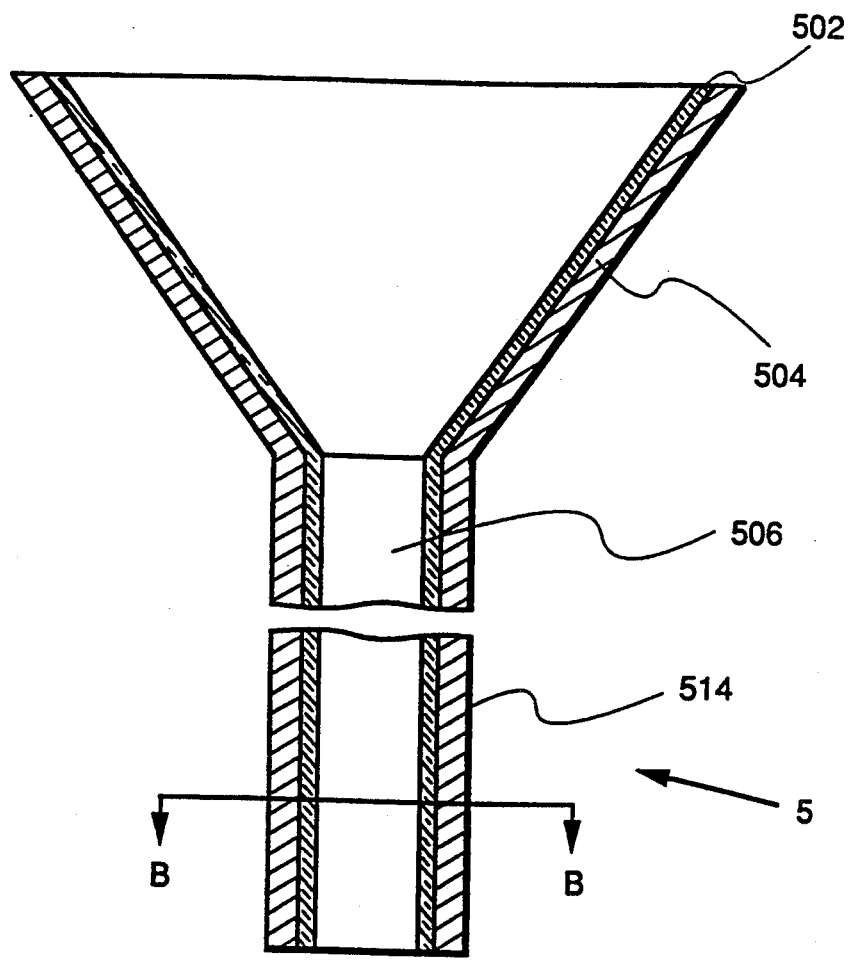
FIG. 5A shows in a cross sectional elevation, a water jet mixing tube of the preferred embodiment.
Figure 5B:
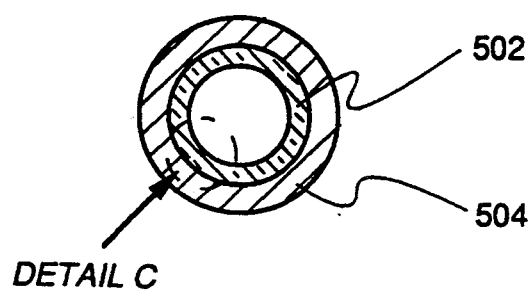
FIG. 5B shows a cross sectional plan view of the water jet mixing tube of FIG. 5A taken along section B—B in FIG. 5A.
Figure 6:
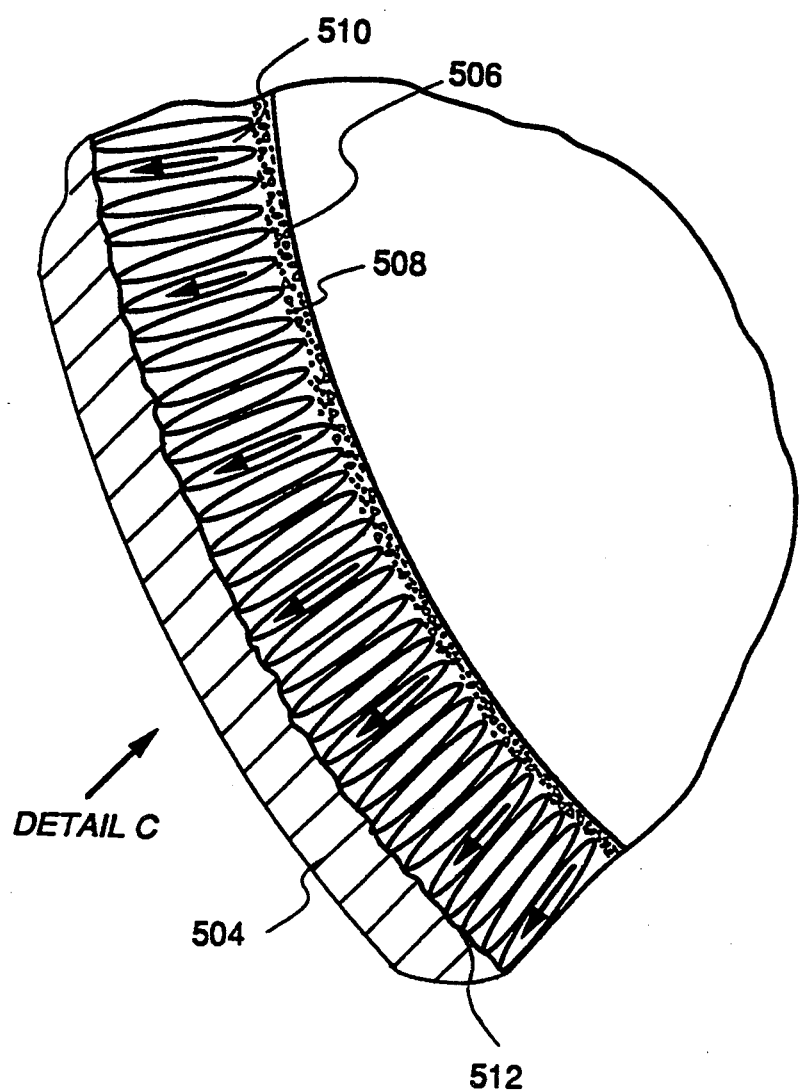
FIG. 6 is a magnified view of Detail C of FIG. 5B illustrating the crystalline structure of diamond of an inner member of the water jet mixing tube of FIG. 5A.

Turning now to FIGS. 5A and 5B, a preferred embodiment comprising a two membered substantially crack free water jet mixing tube generally indicated by numeral 5, is shown. Mixing tube 5 comprises an inner member 502 of diamond. An inner side 506 of inner member 502 is provided with a smooth surface, preferably having surface roughness of less than about 10 microns. Detail C of FIG. 5B, shown in FIG. 6, provides a magnified view of inner side 506. Inner side 506 is provided with a dense generally equiaxed microcrystalline grain structure 508. The grain size of diamond microcrystals along inner side 506 varies from about 1/10 to about 2 microns. Such a grain structure is typically formed during the deposition of a CVD diamond layer on a substrate surface. Such a dense and smooth surface is very helpful in not only reducing frictional drag on AWJ stream 126, shown in FIG. 1, but also in reducing the crack damage to inner side 506. As the deposition of the CVD diamond layer continues, a radially oriented columnar grain structure 510 (in a <110> direction) generally follows microcrystalline grain structure 508. A detailed discussion of Miller indices describing crystal planes of atoms differentiating between <010>, <110> and <111> orientations, shown on pages 65-69 of Elements of Material Science, Second Edition (1964) by Lawrence H. VanVlack of Addison Wesley Publishing Co., Reading, Mass. is incorporated herein by reference. The grains of columnar grain structure 510 vary from about 100 to about 300 microns. An outer side 512 of inner member 502 is significantly rougher than inner side 506.

Inner member 502 is preferably funnel shaped and its stem length, excluding the funnel shaped portion, varies from about 60 millimeters to about 90 millimeters, preferably about 75 millimeters. The bore of the stem end of inner member 502 varies from about 0.10 millimeter to about 5.00 millimeters, preferably about 1.00 millimeter. The L/D ratio defined as a ratio of the stem length to the inner diameter of the inner member 502 is about 45 to 55, preferably about 50. The diameter of the funnel of inner member 502 varies from about 1.0 millimeter to about 15.0 millimeters, preferably about 4.5 millimeters and the funnel angle varies from about 10° to about 45°. The wall thickness of inner member 502 is more than about 0.3 mm. However, it is understood, in view of the graph of FIG. 2, that one skilled in the art would vary all the aforementioned dimensions according to the abrasive particle size, the water jet velocity and other operational variables of AWJ stream 126 in FIG. 1 and it is also construed that the present invention is not restricted to inner member 502 having the aforementioned dimensions.

It is contemplated that one skilled in the art would also utilize some other funnel shapes, such as a funnel having a cylindrical projection for increasing the quantity of abrasive particles stored within the funnel shape or a funnel having a polygonal shape, such as a hexagonal shape, and a rectangular stem.

An outer member 504 is disposed on outer side 512 of inner member 502 and it is made of a material having a higher coefficient of thermal expansion than that of diamond. Inner member 502 is under compression provided by outer member 504. The compressive forces on inner member 502 prevent cracking of inner side 506 when it is repeatedly impacted by the bouncing action of abrasive particles 122 present in AWJ stream 126, shown in FIG. 1. Materials suitable for outer member 504 are tungsten, titanium, tungsten carbide, molybdenum, rhenium, niobium, tantalum, nickel, zirconium, hafnium, vanadium, chromium, brass, zinc, copper, tin, aluminum or alloys thereof. It should be understood that actual material used for producing outer member 504 will depend upon the process, described hereinafter, by which outer member 504 is deposited on outer side 512 of inner member 502. An outer side 514 of outer member 504 may be shaped to conform to a desired shape by the machining methods, such as turning, milling and the like. Alternatively, outer side 514 may be provided with a desired shape along with holding means such as ribs, threads, fillets, screw mounting holes and the like, to fit a standardized receptacle of a conventional AWJ cutting device.

Two-membered substantially crack-free water jet mixing tube 5 of FIGS. 5A and 5B is produced by chemical vapor deposition of diamond of inner member 502 on a hollow support member, generally made of tungsten, molybdenum, rhenium, niobium, tantalum, zirconium, hafnium, nickel, vanadium, chromium or titanium, preferably molybdenum. The support member is provided with a desired shape, such as a funnel shape. The support member (not shown in FIGS. 5A and 5B) is then separated from inner member 502, preferably by etching it away in an etch bath. The etch bath is preferably ultrasonically agitated to dislodge bubbles formed on the support member walls during the etching action. The details of the aforementioned process of forming inner member 502 on the support member and the separation of the support member from inner member 502 are disclosed in a commonly assigned co-pending application, Ser. No. 07/713,499, filed on Jun. 12, 1991, incorporated herein by reference.

Outer member 504 is preferably plasma deposited on outer side 512 of inner member 502. A conventional low pressure radio frequency plasma spray method is most preferred. Details of such a process are disclosed in the commonly assigned U.S. Pat. Nos. 4,786,566, 4,978,585, 4,981,643 and 5,042,710 and a commonly assigned application, Ser. No. 07/524,527, filed on May 19, 1990, all incorporated herein by reference. The materials for outer member 504, such as tungsten, tungsten carbide, molybdenum, rhenium, niobium, tantalum, zirconium, hafnium, nickel, vanadium, chromium, titanium or the alloys thereof may be employed in the aforementioned plasma deposition process. Titanium is preferred. The thickness of outer member 504 should be sufficient to provide constant and sustained compressive pressure on inner member 502 and the thickness of outer member 504 can be calculated from a formula, $$\frac{\text{Thickness of outer member 504}}{\text{Thickness of inner member 502 (diamond)}} \geq \frac{\text{Youngs Modulus } (E_d) \text{ of diamond}}{\text{Youngs Modulus } (E_m) \text{ of outer member 504 material}}$$

Once outer member 504 is formed on inner member 502, by the aforementioned process, and as outer member 504 cools down it produces a compressive stress on inner member 502 that prevents cracking of inner side 506 of inner member 502 when inner side 506 is repeatedly subjected to impaction by abrasive particles 122 present in the AWJ stream 126 of FIG. 1.

In another embodiment of the present invention, outer member 504 may be deposited on inner member 502 by electroforming an electrolessly deposited first metal layer, followed by an electrolytically deposited second metal layer. The electroforming process is adjusted to produce compressive stresses on inner member 502. The aforementioned electroforming process has been disclosed in a commonly assigned co-pending patent application, Ser. No. 07/713,499 filed on Jun. 12, 1991, incorporated herein by reference. The first metal layer may be of copper, nickel or silver. Nickel is preferred. The second metal layer may be made of copper or nickel. Copper is preferred.

In yet another embodiment of the present invention, outer member 504 may be deposited on inner member 502 by casting a metal or a metal alloy around inner member 502. Conventional casting methods, such as monolithic and shell investment casting, high pressure die casting, low pressure casting and centrifugally filled molding are suitable for use in the present invention. The metal or the metal alloy should be a non-carbide forming, low melting point metal. By using such a low melting point metal, any hot tearing of the metal during the cooling is avoided. Hot tearing is defined as a cracking or splitting of a molten metal layer during its cooling on a strong and unyielding surface, such as of diamond. A suitable material for casting of outer member 504 is nickel, brass, copper, aluminum, zinc or tin. Brass is preferred.

The conventional casting process comprises fabricating an investment casting mold in which, inner member 502 is used as a central core of the mold. The infiltration of the molten outer member material along inner side 506 of FIG. 6 is prevented, for example, by filling inner member 502 with a thermally stable material, such as a ceramic powder. Alternatively, an elongated member, such as a wire matched to the inner diameter of mixing tube 5, may be placed inside mixing tube 5. Such a wire could also be used as a fixture to precisely place inner member 502 within the cavity of the casting mold. As stated earlier, outer member 504 made by the aforementioned casting process may be provided with a desired shape having provisions, such as screw mounting holes; lugs, stops and the like, to facilitate the placement of mixing tube 5 in the AWJ cutting device. The invention also contemplates providing the aforestated investment mold with multiple cavities for increasing the rate of production of water jet mixing tube 5.

Figure 7:
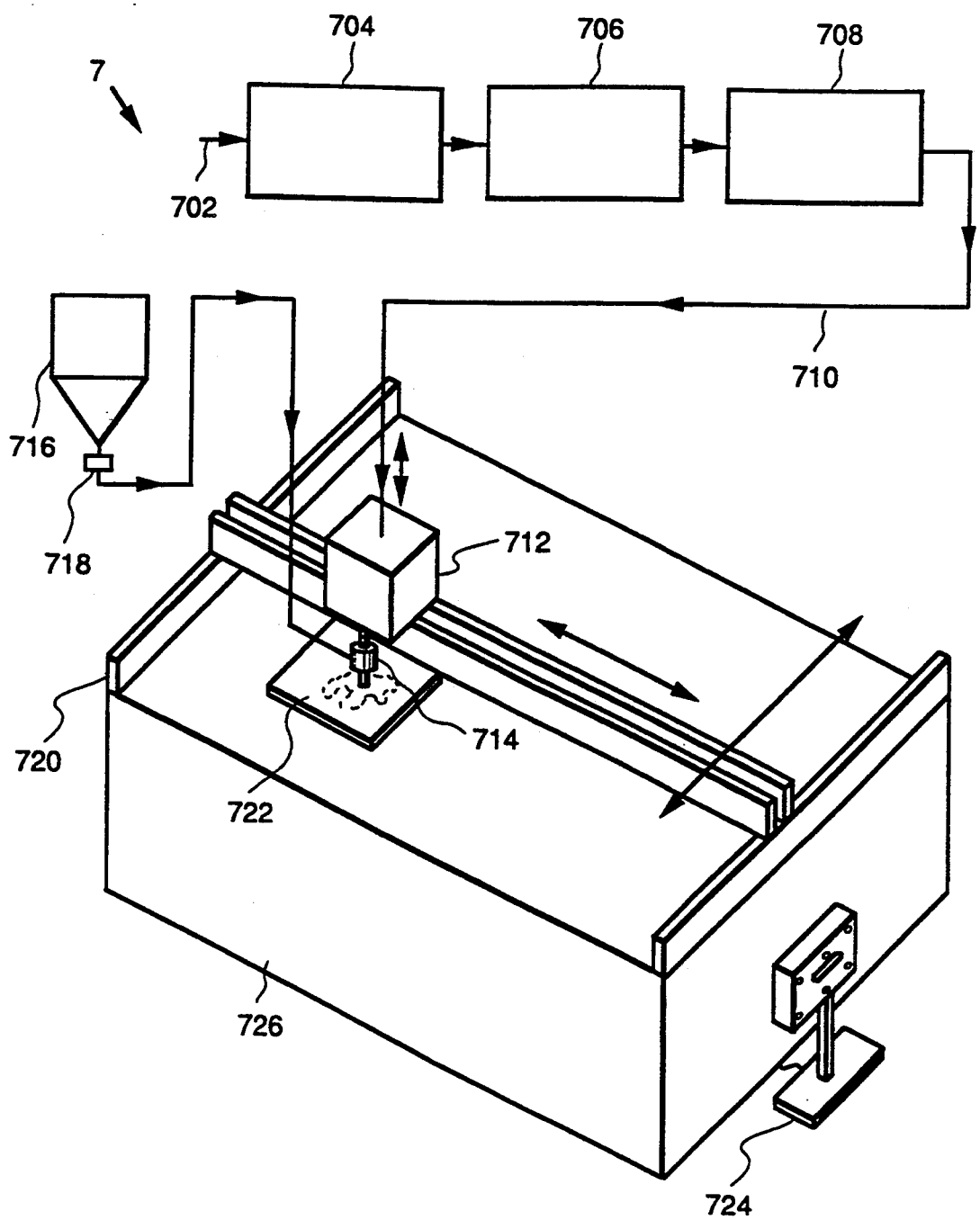
FIG. 7 shows an abrasive water jet device that utilizes the water jet mixing tube of the preferred embodiment.

The present invention is also directed to an abrasive water jet cutting device, shown in FIG. 7, utilizing previously described funnel shaped two membered water jet mixing tube 5. FIG. 7 shows a water line 702 that supplies, preferably a deionized water, to a booster pump 704. The water, under pressure, may be optionally pumped through a water filtration apparatus 706 to reduce the contaminant level in said water to preferably about 0.45 to about 0.50 μm particle size. By keeping the contaminant level in said water low, the clogging of mixing tube 5 of FIG. 5A as well as orifice 118 of FIG. 1 is prevented. The heart of cutting device 7 is a high pressure intensifier pump and accumulator 708. High pressure pump 708 boosts the water pressure to ultra high pressures of about 20,000 to 60,000 psi at a flow rate of about 5 gallons per minute. Typically, high pressure pump 708 is a hydraulically driven, reciprocating plunger type pump. Intensifier pump 708 is based on the principle that, in a hydraulic system, a large piston acting on a smaller piston increases the pressure on the smaller piston in inverse proportion to the respective piston areas. The intensifier pump ratios typically range from about 10:1 to 20:1. The water, under high pressure, is then delivered to the accumulator portion of high pressure pump 708. The accumulator portion of pump 708 evens out the variations in water pressure to less than about ±5%, thereby ensuring a constant pressure flow of water at a uniform flow rate. The high pressure water is delivered through swiveled high pressure pipes 710 to an abrasive jet cutting head 712 mounted on a X-Y-Z axis gantry robot motion control system 720. Gantry system 720 provides head 712 with a three axis movement. An abrasive jet assembly 714 is attached to head 712 and abrasive particles from a hopper 716 are delivered through a metering valve 718 into jet assembly 714. A workpiece 722 is located on the table of device 7 under robot gantry system 720. The partial abrasive water jet assembly 1 of FIG. 1 incorporated with water jet mixing tube 5 of FIGS. 5A and 5B, is part of jet assembly 714 and it is mounted inside assembly 720. The abrasive characteristics of abrasive jet 126, shown in FIG. 1, are controlled preferably through a computer controlled panel 724. A water collection tank 726 is generally provided under the table of device 7 to catch the waste water and the spent abrasive particles.

The present invention also contemplates a water jet cutting device in which, the workpiece is provided with a motion in accordance with a predetermined program while, the AWJ cutting head remains stationary.

EXAMPLE 1

The process in the example set forth below was carried out by the steps described above.

A diamond inner member of a water jet mixing tube was prepared by a conventional low pressure chemical vapor deposition on a support member. The outer side of the diamond inner member had ⅛ inch diameter and a stem length of 1.5 inches. The inner member had a bore of 0.040 inches.

The support was etched away and a molybdenum wire was slipped through the bore of the inner member to hold the diamond inner member during the plasma spray deposition of titanium on the outer side of the inner member. The wire was attached to a rotation and translation mechanism of a conventional low pressure RF plasma spray device. To prevent a reaction of the titanium alloy with the wire holding fixture, the molybdenum wire and the wire holding fixture were coated with a ceria stabilized zirconia deposit applied by using an air plasma spray process. The plasma spray chamber of the plasma spray device was evacuated to a pressure of 21 microns of mercury, filled with argon to a residual pressure of 250 Torr and then the outer side of the inner member was RF plasma deposited with a layer of titanium alloy (Ti-6Al-4V (composition in weight percent)). The plasma spray conditions are given below:

Gun/Substrate Conditions:
Gun to Substrate Distance: 35.5 centimeters
Powder:Ti-6Al-4V
Stroke Length:20.3 centimeters
Powder Size:−80+140 mesh
Rotation Rate:130 rpm
Tank Pressure:250 Torr
Plate Voltage:6.1 kiloVolts
Deposition Time:13 minutes
Plate Current:8.5 amperes
Powder Feed Rate:31 grams/min.
Input Power:51.9 kw
Grid Current:1.0 amperes
Plasma Gun Gas Flows:
Argon Swirl Flow:16 liters per minute
Argon Radial Flow:97 liters per minute
Helium Radial Flow:74 liters per minute
Helium Powder Flow:4.5 liters per minute

EXAMPLE 2

The procedure of Example 1 was repeated on a diamond inner member having a stem length of 3 inches. The rough outer surface of the plasma deposited outer member was sanded to smooth out the surface.

EXAMPLE 3

A diamond inner member of 3 inches in length was plugged at each end with an aluminum oxide ($Al_2O_3$) core pin to prevent infiltration of molten metal during the casting process on the inner side of the inner member. Gypsum bonded silica investment casting plaster was used to cement the core pins to the inner side. The aforementioned assembly was used as a core of a mold made from gypsum bonded silica investment casting plaster having a cavity of the desired shape. The mold and the core were gradually heated from 148° C. to 537° C. and then down to 260° C. for 14 hours to remove moisture from the core and the mold cavity. A molten metal at 500° C., comprising 8.4% aluminum, 1.0% copper, 0.02% magnesium and balance of zinc, all in weight percentages, was poured into the mold cavity maintained at 260° C. After the cure time of one hour, the inner member having the outer cast thereon was removed from the mold and the core pins were separated from the assembly to form the mixing tube.

What is claimed is:

1. A method of producing a substantially crack-free water jet mixing tube of an abrasive water jet cutting device comprising:
   chemical vapor depositing a diamond layer on a support member to form an inner member of said tube, said inner member having a smooth inner side of diamond with a microcrystalline structure;
   separating said inner member from said support member;
   depositing an outer member material having a higher coefficient of thermal expansion than diamond on an outer side of said inner member to form an outer member of said tube; and
   cooling said tube to contract said outer member for inducing compressive stresses of sufficient strength on said inner member to substantially prevent formation of cracks in said inner member.

2. The method according to claim 1 wherein said step of separating said support member from said inner member comprises etching away said support member in an etch bath.

3. The method according to claim 1 wherein said step of depositing said outer member further comprises RF plasma spray depositing said outer member material on said outer side of said inner member.

4. The method according to claim 3 wherein said outer member material is selected from the group consisting of tungsten, tungsten carbide, molybdenum, rhenium, niobium, tantalum, zirconlure, hafnium, nickel, vanadium, chromium and titanium.

5. The method according to claim 1 wherein said step of depositing said outer member further comprises electroforming said outer member material on said outer side of said inner member.

6. The method according to claim 5 wherein said step of electroforming further comprises:
   electrolessly depositing a first metal layer on said outer side of said inner member; and
   electrolytically depositing a second metal layer on said first metal layer.

7. The method according to claim 6 wherein said first metal layer is nickel and said second metal layer is copper.

8. The method according to claim 1 wherein said step of depositing said outer member further comprises casting an outer member material around said inner member placed in a mold.

9. The method according to claim 8 wherein said outer member material is brass, aluminum, copper, zinc or tin.

10. The method according to claim I wherein said support member is a funnel shaped hollow mandrel.

11. A method of producing a substantially crack-free water jet mixing tube of an abrasive water jet cutting device comprising:
   chemical vapor depositing a diamond layer on a funnel shaped hollow support member to form an inner member of said tube, said inner member having a smooth inner side of diamond with a microcrystalline structure;

etching away said support member from said inner member;

casting an outer member material having a higher coefficient of thermal expansion than diamond on an outer side of said inner member to form an outer member of said tube; and cooling said tube to contract said outer member for inducing compressive stresses of sufficient strength on said inner member to substantially prevent formation of cracks in said inner member.

* * * * *